US006438954B1

(12) United States Patent
Goetz et al.

(10) Patent No.: US 6,438,954 B1
(45) Date of Patent: Aug. 27, 2002

(54) MULTI-DIRECTIONAL THERMAL ACTUATOR

(75) Inventors: Douglas P. Goetz, St. Paul; Mike E. Hamerly, Vadnais Heights; Daniel B. Pendergrass, Mendota Heights; Robert G. Smith, Vadnais Heights; Silva K. Theiss, Woodbury; Billy L. Weaver, Eagan, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/845,188

(22) Filed: Apr. 27, 2001

(51) Int. Cl.[7] ............................................... F01B 29/10
(52) U.S. Cl. ...................... 60/527; 310/306; 310/307; 310/309
(58) Field of Search .................... 60/527, 528; 310/306, 310/307, 309

(56) References Cited

U.S. PATENT DOCUMENTS 3,833,876 A * 9/1974 Bassett ....................... 337/370
4,679,908 A 7/1987 Goodwin (List continued on next page.)

FOREIGN PATENT DOCUMENTS

| EP | 0 672 931 A1 | 9/1995 |
| EP | 0 713 117 A1 | 5/1996 |
| EP | 0 924 763 A2 | 6/1999 |
| EP | 0 961 150 A2 | 12/1999 |
| EP | 0 986 106 A1 | 3/2000 |
| WO | 89/09477 | 10/1989 |
| WO | 93/21663 | 10/1993 |
| WO | 96/34417 | 10/1996 |

OTHER PUBLICATIONS

Cowen et al., "Vertical Thermal Actuators for Micro–Opto–Electro–Mechanical Systems", 3226 SPIE, pp. 137–146 (1997).
Harsh et al., "The Realization and Design Considerations of a Flip–Chip Integrated MEMS Tunabel Capacitor", 80 Sensors and Actuators, pp. 108–118 (2000).
Harsh et al., "Flip–Chip Assembly for SI–Based RF MEMS", IEEE Conference on Micromechanical Systems, 35 pp. 273–278 (1999).
Feng et al., "MEMS–Based Variable Capacitor for Millimeter–Wave Applications", Soild State Sensor and Actuator Workshop, pp. 255–258 (2000).
Noworolski et al., "Process for In–Plane and Out–of–Plane Single–Crystal–Silicon Thermal Microactuators", 55 Sensors and Actuators, pp. 65–69 (1996).
Riethmuller et al., "Thermally Excited Silicon Microactuators", 3 IEEE Transactions on Electron Devices, pp. 758–763 (1988).

(List continued on next page.)

Primary Examiner—Hoang Nguyen
(74) Attorney, Agent, or Firm—Scott A. Bardell

(57) ABSTRACT

A micrometer sized multi-directional thermal actuator capable of repeatable and rapid displacement in a substantially horizontal direction, a substantially vertical direction, and/or a combination thereof. The multi-directional thermal actuator constructed on a surface of a substrate includes three or more beams each cantilevered from one or more anchors at a first end to extend generally parallel to the surface of the substrate. A member mechanically and electrically couples the distal ends of the beams. Application of current to a circuit comprising combinations of any two or more of the beams displaces the member in one of three or more non-parallel radial directions, respectively.

46 Claims, 5 Drawing Sheets

U.S. PATENT DOCUMENTS

| | | | |
|---|---|---|---|
| 4,688,885 A | | 8/1987 | Poteat et al. |
| 5,024,500 A | | 6/1991 | Stanley et al. |
| 5,206,557 A | | 4/1993 | Bobbio |
| 5,290,400 A | | 3/1994 | Bobbio |
| 5,351,412 A | | 10/1994 | Furuhata et al. |
| 5,401,983 A | | 3/1995 | Jokerst et al. |
| 5,418,418 A | | 5/1995 | Hirano et al. |
| 5,489,812 A | | 2/1996 | Furuhata et al. |
| 5,506,175 A | | 4/1996 | Zhang et al. |
| 5,536,988 A | | 7/1996 | Zhang et al. |
| 5,602,955 A | | 2/1997 | Haake |
| 5,685,062 A | | 11/1997 | McCarthy et al. |
| 5,719,073 A | | 2/1998 | Shaw et al. |
| 5,781,331 A | * | 7/1998 | Carr et al. .................. 359/288 |
| 5,846,849 A | | 12/1998 | Shaw et al. |
| 5,847,454 A | | 12/1998 | Shaw et al. |
| 5,912,094 A | | 6/1999 | Aksyuk et al. |
| 5,914,801 A | * | 6/1999 | Dhuler et al. ............... 359/230 |
| 5,959,376 A | | 9/1999 | Allen |
| 5,960,132 A | | 9/1999 | Lin |
| 5,962,949 A | | 10/1999 | Dhuler et al. |
| 5,963,367 A | | 10/1999 | Aksyuk et al. |
| 5,994,159 A | | 11/1999 | Aksyuk et al. |
| 5,995,688 A | | 11/1999 | Aksyuk et al. |
| 6,014,240 A | | 1/2000 | Floyd et al. |
| 6,067,797 A | | 5/2000 | Silverbrook |
| 6,070,656 A | | 6/2000 | Dickey |
| 6,275,325 B1 | | 8/2001 | Sinclair |

OTHER PUBLICATIONS

Thielicle et al., "Microactuators and Their Technologies", 10 Mechatronics, pp. 431–455 (2000).

Burns et al., Design and Performance of a Double Hot Arm Polysilicon Thermal Actuator, 3224 SPIE, pp. 296–306 (1997).

Read et al., "Mechanical and Optical Characterization of Thermal Microactuators Fabricated in a CMOS Process", 2642 SPIE, pp. 22–32 (1995).

Comtois et al., "Thermal Microactuators for Surface–Micromachining Processes", 2642 SPIE, pp. 10–21 (1995).

Comtois et al., "Characterization of Electrothermal Actuators and Arrays fabricated in a Four–level, Planarized Surface–Micromachined and Polycrystalline Silicon Process", Intl' Conf. On Solid–State Sensors and Actuators, pp. 679–772 (1997).

Reid et al., "Automated Assembly of Flip–Up Micromirrors". 66 Sensors and Actuators, pp. 292–298 (1998).

Toshiyoshi et al., "Electromagnetic Torsion Mirrors for Self–Aligned Fiber–optic Crossconnectors by Micromachining", 5 IEEE Journal of Selected Topics in Quantum Mechanics, pp. 10–17 (1999).

Thielicke et al., "Microactuators and their Technologies", 10 Mechatronics, pp. 431–455 (2000).

Chiou et al., "A Micromirror Device with Tilt and Piston Motions", 3893 SPIE, pp. 298–303 (1999).

Aksyuk et al., "Stress–Induced Curvature Engineering in Surface–Micromachined Devices", 3680 SPIE, pp. 984–993 (1999).

Koester et al., "MUMPs™ Design Handbook", Revision 5.0 Cronos Integrated Microsystems, pp. 1–38 (2000).

* cited by examiner

MULTI-DIRECTIONAL THERMAL ACTUATOR

FIELD OF THE INVENTION

The present invention relates generally to micro-mechanical devices, and more particularly, to a micrometer sized thermal actuator that is capable of repeatable and rapid movement horizontally across a substrate, vertically off the surface of the substrate, or a combination thereof.

BACKGROUND OF THE INVENTION

Fabricating complex micro-electro-mechanical systems (MEMS) and micro-optical-electro-mechanical systems (MOEMS) devices represents a significant advance in micro-mechanical device technology. Presently, micrometer-sized analogs of many macro-scale devices have been made, such as, for example, hinges, shutters, lenses, mirrors, switches, polarizing devices, and actuators. These devices can be fabricated, for example, using Multi-user MEMS processing (MUMPs) available from Cronos Integrated Microsystems located at Research Triangle Park, N.C. Applications of MEMS and MOEMS devices include, for example, data storage devices, laser scanners, printer heads, magnetic heads, micro-spectrometers, accelerometers, scanning-probe microscopes, near-field optical microscopes, optical scanners, optical modulators, micro-lenses, optical switches, and micro-robotics.

One method of forming a MEMS or MOEMS device involves patterning the device in appropriate locations on a substrate. As patterned, the device lies flat on top of the substrate. For example, the hinge plates of a hinge structure or a reflector device are both formed generally coplanar with the surface of the substrate using the MUMPs process. One challenge to making use of these devices is moving them out of the plane of the substrate.

Coupling actuators with micro-mechanical devices allows for moving these devices out of the plane of the substrate. Various types of actuators, including electrostatic, piezoelectric, thermal and magnetic have been used for this purpose.

One such actuator is described by Cowan et al. in "Vertical Thermal Actuator for Micro-Opto-Electro-Mechanical Systems," v. 3226, SPIE, pp. 137–146 (1997). The actuator 20 of Cowan et al. illustrated in FIG. 1 uses resistive heating to induce thermal expansion. The hot arm 22 is higher than the cantilever arm 24, so that thermal expansion drives the actuator tip 26 toward the surface of the substrate 28. At sufficiently high current, the downward deflection of the actuator tip 26 is stopped by contact with the substrate 28 and the hot arms 22 bow upward. Upon removal of the drive current, the hot arms 22 rapidly "freeze" in the bowed shape and shrink, pulling the actuator tip 26 upward, as illustrated in FIG. 2.

The deformation of the hot arm 22 is permanent and the actuator tip 26 remains deflected upward without applied power, forming a backbent actuator 32. Further application of the drive current causes the backbent actuator 32 to rotate in the direction 30 toward the surface of the substrate 28. The backbent actuator 32 of FIG. 2 is typically used for setup or one-time positioning applications. The actuators described in Cowan et al. are limited in that they cannot rotate or lift hinged plates substantially more than forty-five degrees out-of-plane in a single actuation step.

Harsh et al., "Flip Chip Assembly for Si-Based Rf MEMS" Technical Digest of the Twelfth IEEE International Conference on Micro Electro Mechanical Systems, IEEE Microwave Theory and Techniques Society 1999, pp. 273–278; Harsh et al., "The Realization and Design Considerations of a Flip-Chip Integrated MEMS Tunable Capacitor" 80 Sensors and Actuators, pp. 108–118 (2000); and Feng et al., "MEMS-Based Variable Capacitor for Millimeter-Wave Applications" Solid-State Sensor and Actuator Workshop, Hilton Head Island, S.C. 2000, pp. 255–258, disclose various vertical actuators based upon a flip-chip design. During the normal release etching step, the base oxide layer is partially dissolved and the remaining MEMS components are released. A ceramic substrate is then bonded to the exposed surface of the MEMS device and the base polysilicon layer is removed by completing the etch of the base oxide layer (i.e., a flip chip process). The resultant device, which is completely free of the polysilicon substrate, is a capacitor in which the top plate of the capacitor is controllably moved in a downward fashion toward an opposing plate on the ceramic substrate. The device is removed from the polysilicon substrate because stray capacitance effects of a polysilicon layer would at a minimum interfere with the operation of the device.

Lift angles substantially greater than forty-five degrees are achievable with a dual-stage actuator system. A dual-stage actuator system typically consists of a vertical actuator and a motor. The vertical actuator lifts the hinged micro-mechanical device off of the substrate to a maximum angle not substantially greater than forty-five degrees. The motor, which has a drive arm connected to a lift arm of the micro-mechanical device, completes the lift. One such dual-stage assembly system is disclosed by Reid et al. in "Automated Assembly of Flip-Up Micromirrors," Transducers '97, Int'l Conf. Solid-State Sensors and Actuators, pp. 347–350 (1997). These dual stage actuators are typically used for setup or one-time positioning applications.

BRIEF SUMMARY OF THE INVENTION

The present invention is directed to a micrometer sized, multi-directional thermal actuator capable of repeatable and rapid displacement in a substantially horizontal direction, a substantially vertical direction, or a combination thereof. In some embodiments, the thermal actuator can be displaced radially in substantially any direction relative to an unactivated position, where radial refers to a direction generally perpendicular to the longitudinal axes of the beam.

In one embodiment, the multi-directional thermal actuator constructed on a surface of a substrate includes first, second, and third beams cantilevered from an anchor at first ends to extend generally parallel to the surface of the substrate in an unactivated configuration. The first, second, and third beams are not coplanar. A member mechanically couples distal ends of the first, second, and third beams. A first circuit comprises at least the first beam, whereby application of current to the first circuit displaces the member in a first radial direction. A second circuit comprises at least the second beam, whereby application of current to the second circuit displaces the member in a second radial direction. A third circuit comprises at least the third beam, whereby application of current to the third circuit displaces the member in a third radial direction.

In one embodiment, a grounding tab electrically couples one or more of the beams to the substrate. A resistance can optionally be located between one or more of the beams and ground. In one embodiment, the first and second beams comprise a first circuit, the second and third beams comprise a second circuit, and the third and first beams comprise a third circuit. In another embodiment, the first beam and a grounding tab comprise a fourth circuit, the second beam and a grounding tab comprise a fifth circuit, and the third beam and a grounding tab comprise a sixth circuit. The same or different levels of current can be applied to one or more of the circuits simultaneously. The first, second, and third beams can be arranged in a symmetrical or an asymmetrical cross-sectional configuration.

Another embodiment includes a fourth beam cantilevered from an anchor at a first end to extend generally parallel to the surface of the substrate in an unactivated configuration. The fourth beam is mechanically coupled to the member.

In the four beam embodiment, the first and fourth beams comprise a seventh circuit, whereby application of current to the seventh circuit displaces the member in a seventh radial direction. The second and fourth beams comprise an eighth circuit, whereby application of current to the eighth circuit displaces the member in a eighth radial direction. The third and fourth beams comprise a ninth circuit, whereby application of current to the ninth circuit displaces the member in a ninth radial direction. The first, second, third and fourth beams can arranged in a symmetrical or an asymmetrical cross-sectional configuration.

In some embodiments, the multi-directional thermal actuator includes a cold arm having a first end anchored to the surface of the substrate and a distal end mechanically coupled to the member. The beam can be arranged either symmetrically or asymmetrically with respect to the cold arm.

The present invention is also directed to a multi-directional thermal actuator constructed on a surface of a substrate comprising at least three beams each cantilevered from one or more anchors at a first end to extend generally parallel to the surface of the substrate in an unactivated configuration, wherein at least one of the beams is not coplanar with the other two beams. A member mechanically and electrically couples the distal ends of the beams, whereby application of current to a circuit comprising combinations of any two or more of the beams displaces the member in one of three or more non-parallel radial directions, respectively.

In one embodiment, the multi-directional thermal actuator constructed on a surface of a substrate includes two lower hot arms each cantilevered from one or more anchors at a first end to extend generally parallel to the surface of the substrate and two upper hot arms each cantilevered from one or more anchors at a first end to extend generally parallel to the surface of the substrate. The two upper hot arms are arranged above the two lower hot arms, respectively. A member mechanically and electrically couples the distal ends of the upper and lower hot arms.

The actuator exhibits vertical displacement when current is applied to the two lower hot arms or the two upper hot arms. The actuator exhibits horizontal displacement when current is applied to one of the lower hot arms and the upper hot arm located above the lower hot arm. The actuator exhibits both horizontal and vertical displacement when current is applied to any three of the hot arms.

In one embodiment, a cold arm having a first end anchored to the surface of the substrate and a distal end is located generally parallel with the upper and lower hot arms. The cold arm is preferably located symmetrically with respect to the hot arms. In one embodiment, the cold arm is located centrally within a generally rectangular space bounded by the upper and lower hot arms. A flexure is optionally formed in the cold arm near the first end thereof. The flexure comprises at least one of a recess, depression, cut-out, hole, location of narrowed, thinned or weakened material, alternate material or other structural features or material change that decreases resistance to bending in that location. In another embodiment, the cold arm includes a reinforcing member. The reinforcing member can be integrally formed in the cold arm. A metal layer optionally extends along the cold arm to reduce current density.

In one embodiment, the cold arm is electrically isolated from the hot arms. In another embodiment, the hot arms and the cold arm comprise a circuit through which electric current can pass. The actuator exhibits both horizontal and vertical displacement when current is applied to a circuit comprising the cold arm and any one of the hot arms, any three of the hot arms, or two unbalanced sets of arms. A grounding tab can optionally be provided to electrically couple one or more of the hot arms to the substrate.

A plurality of multi-directional thermal actuators can be formed on a single substrate. At least one optical device can be mechanically coupled to the multi-directional thermal actuator. The optical device comprises one of a reflector, a lens, a polarizer, a wave guide, a shutter, or an occluding structure. The present invention is also directed to an optical communication system including at least one optical device.

BRIEF DESCRIPTION OF THE SEVERAL VIEWS OF THE DRAWING

Further features of the invention will become more apparent from the following detailed description of specific embodiments thereof when read in conjunction with the accompany drawings.

DETAILED DESCRIPTION OF THE INVENTION

Figure 1:
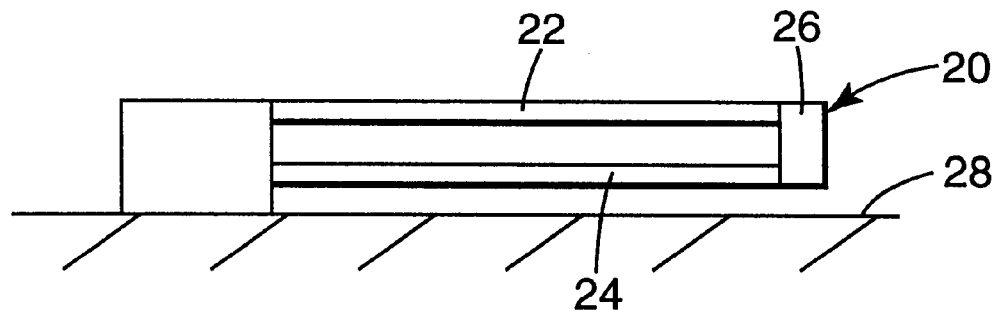
FIG. 1 is a side view of a thermal actuator prior to backbending.
Figure 2:
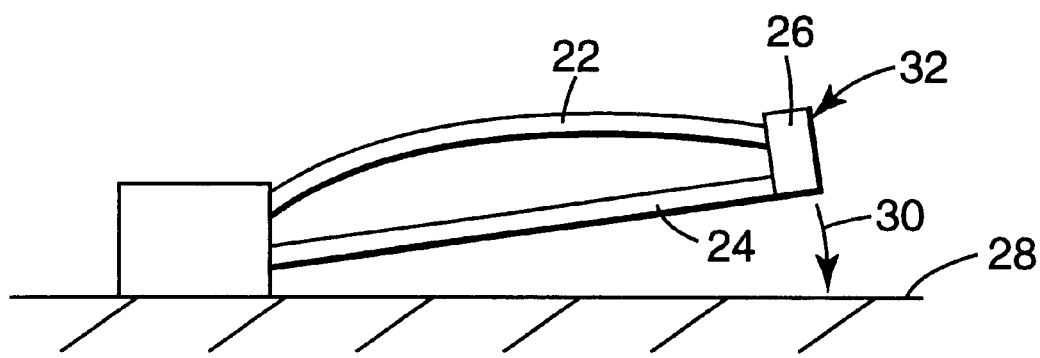
FIG. 2 is a side view of the thermal actuator of FIG. 1 after backbending.

The present invention relates to a multi-directional thermal actuator for micro-mechanical devices. The micrometer sized multi-directional thermal actuator is capable of repeatable and rapid movement in a substantially horizontal direction, a substantially vertical direction out-of-plane, or a combination thereof. The present multi-directional thermal actuator can be engineered to have one or more preferred directions of radial displacement.

As used herein, "micro-mechanical device" refers to micrometer-sized mechanical, opto-mechanical, electromechanical, or opto-electro-mechanical device constructed on the surface of a substrate. Various technologies for fabricating micro-mechanical devices are available, such as, for example, the Multi-User MEMS Processes (MUMPs) from Cronos Integrated Microsystems located at Research Triangle Park, N.C. One description of the assembly procedure is described in "MUMPs Design Handbook," revision 6.0 (2001) available from Cronos Integrated Microsystems.

Polysilicon surface micromachining adapts planar fabrication process steps known to the integrated circuit (IC) industry to manufacture micro-electro-mechanical or micro-mechanical devices. The standard building-block processes for polysilicon surface micromachining are deposition and photolithographic patterning of alternate layers of low-stress polycrystalline silicon (also referred to a polysilicon) and a sacrificial material (e.g., silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers.

The result is a construction system generally consisting of a first layer of polysilicon which provides electrical interconnections and/or a voltage reference plane, and additional layers of mechanical polysilicon which can be used to form functional elements ranging from simple cantilevered beams to complex electromechanical systems. The entire structure is located in-plane with respect to the substrate. As used herein, the term "in-plane" refers to a configuration generally parallel to the surface of the substrate and the terms "out-of-plane" refer to a configuration greater than zero degrees to about ninety degrees relative to the surface of the substrate.

Typical in-plane lateral dimensions of the functional elements can range from one micrometer to several hundred micrometers, while the layer thicknesses are typically about 1–2 micrometers. Because the entire process is based on standard IC fabrication technology, a large number of fully assembled devices can be batch-fabricated on a silicon substrate without any need for piece-part assembly.

Figure 3:
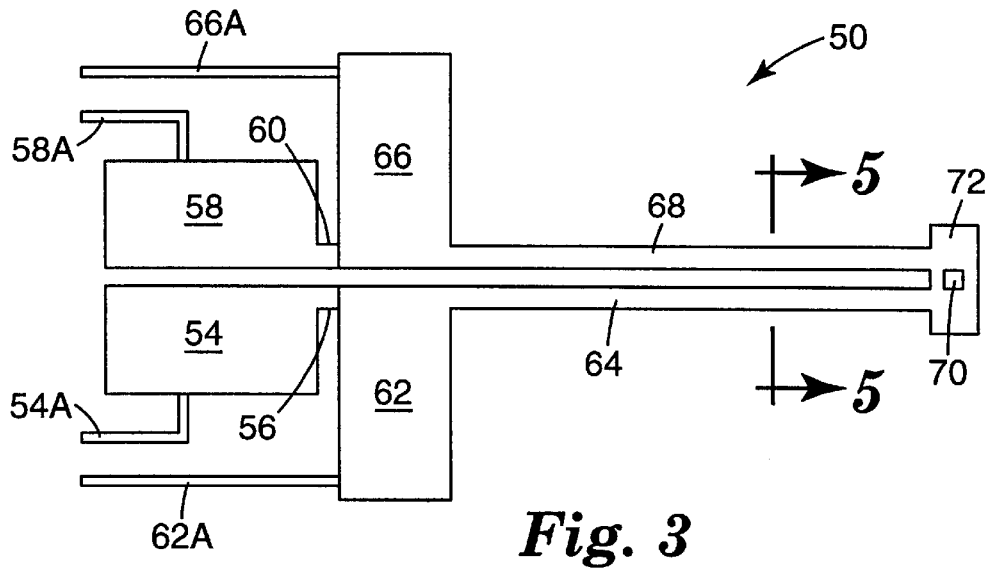
FIG. 3 is a top view of a multi-directional thermal actuator in accordance with the present invention.
Figure 4:
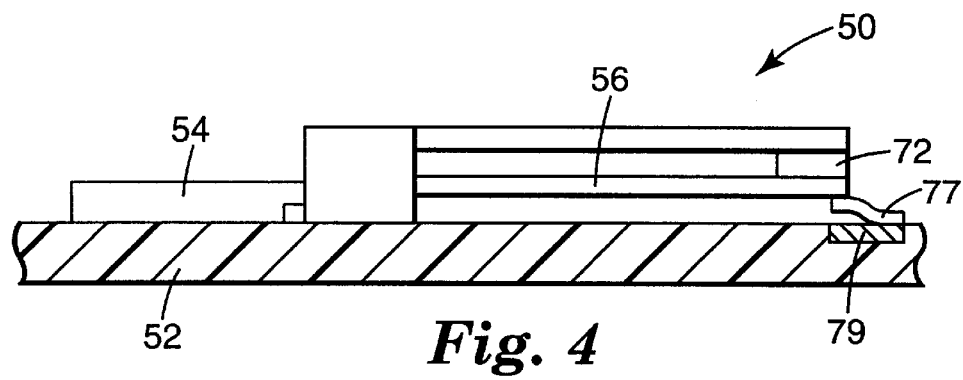
FIG. 4 is a side view of the multi-directional thermal actuator of FIG. 3.
Figure 5:
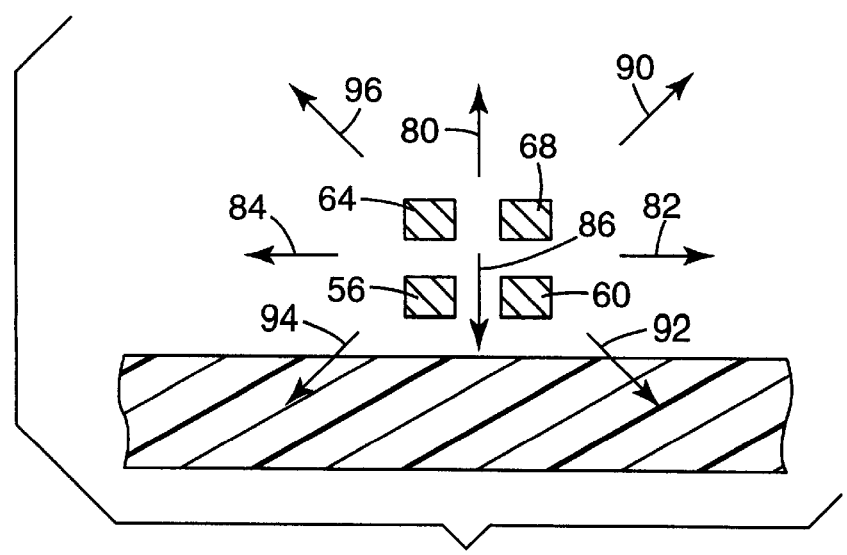
FIG. 5 is a sectional view of the multi-directional thermal actuator of FIG. 3.

FIGS. 3 through 5 illustrate a first embodiment of a multi-directional thermal actuator 50 constructed on substrate 52 in accordance with the present invention. The multi-directional thermal actuator 50 is oriented in-plane on the surface of the substrate 52. The substrate 52 typically comprises a silicon wafer with a layer of silicon nitride deposited thereon. As used herein, "multi-directional thermal actuator" refers to a micro-mechanical device capable of repeatably moving substantially horizontally across a substrate, substantially vertically off a substrate, or a combination thereof. The multi-directional thermal actuator may optionally have one or more preferred directions of radial displacement. The force generated in the direction of the preferred direction of radial displacement is typically greater than the force generated in other directions of bending. The multi-directional thermal actuator will typically have greater stiffness or resistance to bending in directions other than the preferred direction of radial displacement.

The multi-directional thermal actuator 50 includes anchor 54 with a first lower beam 56 extending in a cantilevered fashion therefrom and anchor 58 with a second lower beam 60 extending in a cantilevered fashion generally parallel to the first lower beam 56. Anchor 62 includes a first upper beam 64 extending in a cantilevered fashion therefrom and anchor 66 with a second upper beam 68 extending in a cantilevered fashion generally parallel to the first upper beam 64. In an alternate embodiment, two or more of the beams 56, 60, 64, 68 may be cantilevered from the same anchor, but need to be electrically isolated from each other.

Figure 7:
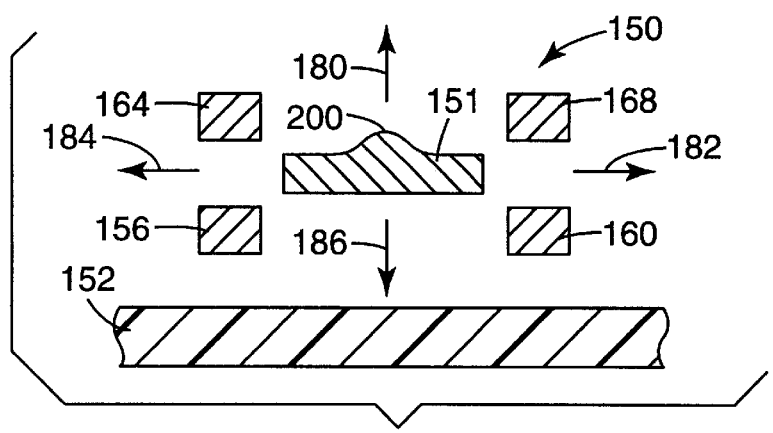
FIG. 7 is a sectional view of the multi-directional thermal actuator of FIG. 6.
Figure 8:
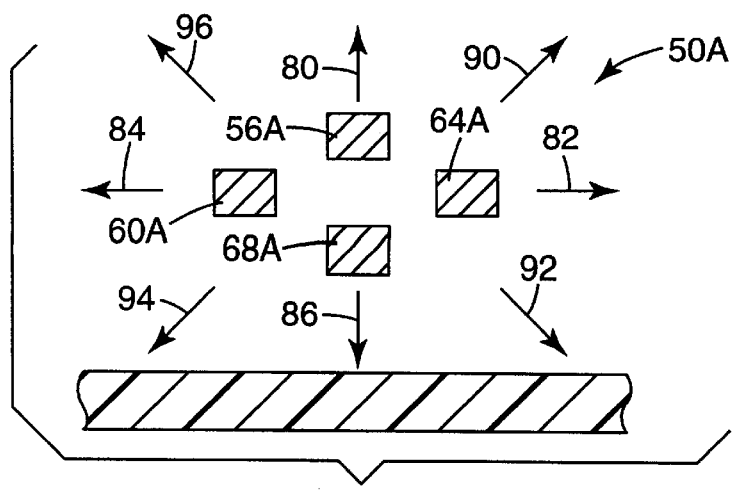
FIG. 8 is a sectional view of an alternate thermal actuator in accordance with the present invention.

As best illustrated in FIG. 5, the beams 56, 60, 64, 68 are arranged in a generally rectangular cross-sectional configuration (see also FIG. 8). As used herein, "cross-sectional configuration" refers to a sectional view taken perpendicular to the longitudinal axes of the beams, typically near the distal ends. The cross-sectional configuration can be symmetrical or asymmetrical. Examples of rectangular cross-sectional configurations are found in FIGS. 5 and 7. Examples of symmetrical cross-sectional configurations are found in FIGS. 5 and 7—9. An asymmetrical cross-sectional configuration is illustrated in FIG. 10.

In the embodiment illustrated in FIG. 3, the anchors 54, 58, 62, 66 are each connected to one or more electrical traces 54A, 58A, 62A, 66A to deliver electrical current to and/or to electrically ground any of the beams 56, 60, 64, 68. The traces 54A, 58A, 62A, 66A typically extend to the edge of the substrate 52. A wide variety of electric contact devices and/or packaging methods such as a ball grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP) can be used to deliver electric current to, and/or to apply a resistance across, the anchors 54, 58, 62, 66 and/or the beams 56, 60, 64, 68.

Figure 12:
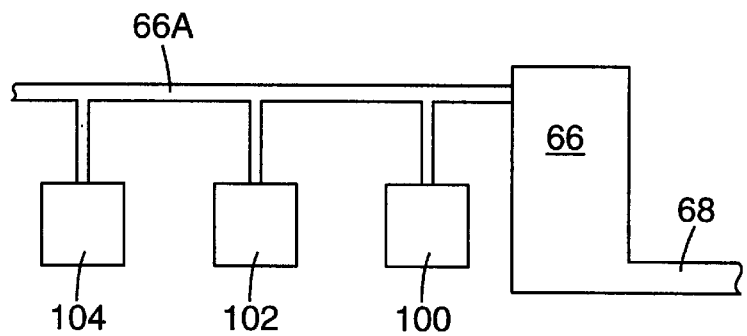
FIG. 12 is a schematic illustration of electrical traces connected to an anchor in accordance with the present invention.
Figure 13:
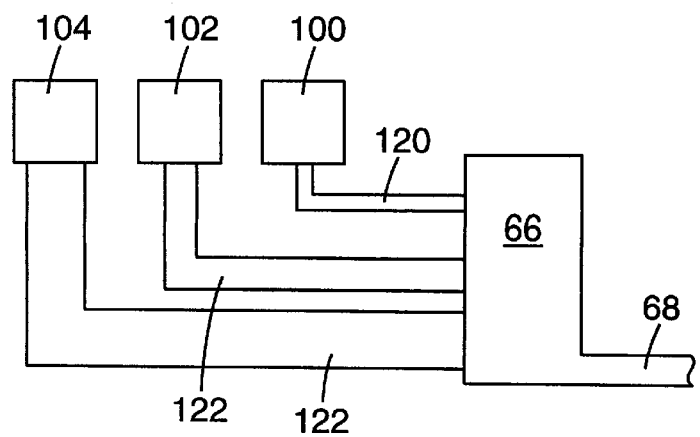
FIG. 13 is a schematic illustration of alternate electrical traces connected to an anchor in accordance with the present invention.

Various configurations can be used to vary the current density applied to individual beams 56, 60, 64,68. In one embodiment, the traces 54A, 58A, 62A, 66A include a resistance that can be applied to reduce the current density in the corresponding beam 56, 60, 64, 68. FIG. 12 schematically illustrates the anchor 66 and the trace 66A of FIG. 3. Trace 66A can optionally include a series of contacts 100, 102, 104 adapted to provide electrical current to the beam 68. The amount of current applied to the different contacts 100, 102, 104 can vary. Alternatively, current can be selectively applied to different combinations of contacts 100, 102, 104. Alternatively, the contacts 100, 102, 104 can be variable resistors adapted to redirect a portion of the current in the trace 66A to ground. In another embodiment illustrated in FIG. 13, the trace 66A is replaced by a series of traces 120, 122, 124 of varying width. Current is selectively applied to the contacts 100, 102, 104. The wider trace 124, however, has a lower resistivity than the narrower trace 120.

The beams 56, 60, 64, 68 are mechanically coupled at their respective distal ends by member 72. Via 70 is formed at the member 72 to mechanically couple the beams 56, 60, 64, 68. Other structures may be used to mechanically couple the beams 56, 60, 64, 68 to the member 72. Some or all of the beams 56, 60, 64, 68 can be electrically coupled at the member 72 to form electric circuit.

In one embodiment, any or all of the beams 56, 60, 64, 68 can be electrically coupled to the substrate 52 by grounding tab 77. The grounding tab 77 electrically couples one or more of the beams 56, 60, 64, 68 to an electrical contact 79 on the substrate 52 in both the unactivated configuration and the activated configuration. The grounding tab 77 permits current to flow through a single beam, such as the beam 56 to displace the member 72 in the direction 90. The grounding tab 77 can be a flexible member or a spring member that is adapted to maintain contact with the substrate 52. A grounding tab, such as the tab 77, can be used with any of the embodiments disclosed herein.

Although the embodiment of FIGS. 3–5 illustrate the beams 56, 60, 64, 68 substantially the same, the material and/or geometry of the beams 56, 60, 64, 68 can be adapted to have different current densities for a given voltage. In one embodiment, some of the beams 56, 60, 64, 68 are formed from a material with a coefficient of linear thermal expansion less than the coefficient of linear thermal expansion of the other beams. In yet another embodiment, some of the beams 56, 60, 64, 68 are provided with a lower electrical resistivity by having a larger cross-sectional area. In another embodiment, a conductive layer is provided on some of the beams 56, 60, 64, 68. Suitable conductive materials include metals such as aluminum, copper, tungsten, gold, or silver, semiconductors, and doped organic conductive polymers such as polyacetylene, polyaniline, polypyrrole, polythiophene, polyEDOT and derivatives or combinations thereof. Consequently, the net expansion of the beams 56, 60, 64, 68 for a given level of current can be engineered for the particular application.

Other aspects of thermal actuators applicable to the present invention are disclosed in commonly assigned U.S. Patent applications entitled "Direct Acting Vertical Thermal Actuator", filed Sep. 12, 2000, U.S. application Ser. No. 09/659,572; "Direct Acting Vertical Thermal Actuator with Controlled Bending", filed Sep. 12, 2000, U.S. application Ser. No. 09/659,798; and "Combination Horizontal and Vertical Thermal Actuator", filed Sep. 12, 2000, U.S. application Ser. No. 09/659,282.

The beams 56, 60, 64, 68 are physically separated from the substrate 52 so that the member 72 is located above the substrate 52. In an unactivated or neutral configuration illustrated in FIG. 4, the beams 56, 60, 64, 68 are generally parallel to the surface of the substrate 52. As used herein, the "unactivated configuration" refers to a voltage differential between all of the beams of about zero.

By selectively applying current to one or more of the beams 56, 60, 64, 68, the member 72 can be made to move from the neutral or unactivated configuration illustrated in FIG. 5 to an activated configuration. The "activated configuration" refers to applying sufficient electrical current to one or more of the beams to displace the member 72 from the unactivated configuration. By selectively applying the same or varying amounts of current to one or more of the beams 56, 60, 64, 68, the member 72 can be made to move in any radial direction.

The beam or beams where current is applied are the "hot arms" and the beams where no current or less current is applied are the cold arms. As used herein, "hot arm" or "hot arms" refer to beams or members that have a higher temperature than the cold arm(s) due to the higher current density than the cold arm(s) when a voltage is applied. Consequently, the hot arm(s) have a greater thermal expansion than the cold arms. "Cold arm" or "cold arms" refer to beams or members that have a lower temperature due to the lower current density than the current density in the hot arm(s) when a voltage is applied. In some embodiments, the cold arm(s) has a current density of zero.

Current can be applied to a circuit comprising one or more of the beams 56, 60, 64, 68. Breaking the connection to ground substantially stops the current flow in one or more of the beams 56, 60, 64, and 68. In a circuit comprising a single beam, the grounding tab 77 is required to complete the circuit. By selectively applying current to the beams 56, 60, 64, 68 and/or modifying the arrangement and properties of the beams 56, 60, 64, 68, the present multi-directional thermal actuator can be made to move in any radial direction from the neutral position. As used herein, "radial" refers to a direction generally perpendicular to the longitudinal axes of the beams. As discussed below, any configuration of at least three non-coplanar arms for which the current density can be selectively controlled are moveable in any radial direction.

It is also possible to modify the current density in one or more beams. For example, if the circuit includes three beams, it is also possible to insert a resistance between any of the hot arms and ground to selectively limit the current density in a particular beam. In this configuration, two of the beams have a first current density (and a first rate of thermal expansion) and a third beam can have a second, higher current density and a second (higher) rate of thermal expansion. In effect, the current of the third beam is divided amongst the two beams with the first current density. In another embodiment, each of the beams have a different resistivity, typically due to their respective geometry. Consequently, the rate of thermal expansion will vary for each of the three beams.

Alternatively, the current density can be modified in a particular beam in a configuration that includes two beams and a grounding tab. For example, one beam and a grounding tab can form a circuit with a first current density (and a first rate of thermal expansion) and the second beam can include a resistance resulting in a second, lower current density and a second (lower) rate of thermal expansion.

In another embodiment, the grounding tab comprises the resistance. For example, one beam and a grounding tab can form a circuit with a first current density (and a first rate of thermal expansion). The second beam has a second, higher current density and a second (higher) rate of thermal expansion.

Selectively applying current to any two adjacent beams 56, 60, 64, 68, moves the member 72 in any of the radial directions 80, 82, 84, 86. The radial directions 82, 84 correspond to the x-axis and the radial directions 80, 86 correspond to the z-axis. For example, current is applied to the beams 56, 64. The electric current heats the hot arms 56, 64 and causes them to increase in length. Since the hot arms 56, 64 are laterally offset from the cold arms 60, 68, increasing the length of the hot arms 56, 64 causes horizontal displacement of the member 72 in the radial direction 82. Alternatively, current can be applied to the hot arms 60, 68. Increasing the length of the hot arms 60, 68 relative to the length of the cold arms 56, 64 causes horizontal displacement of the member 72 in the radial direction 84. As used herein, "horizontal displacement" refers to the displacement parallel to the plane of the substrate.

In another example, current is applied to the hot arms 56, 60. Increasing the length of the hot arms 56, 60 relative to the length of the cold arms 64, 68 causes vertical displacement of the member 72 in the radial direction 80. Alternatively, increasing the length of the hot arms 64, 68 relative to the length of the cold arms 56, 60 causes vertical displacement of the member 72 in the radial direction 86. As used herein, "vertical displacement" refers to displacement perpendicular to the plane of the substrate.

In yet another embodiment, the multi-directional thermal actuator 50 can be sequentially displaced both vertically and horizontally. For example, current can first be applied to the hot arms 56, 60 to cause vertical displacement of the member 72 in the radial direction 80. While current is still being applied to the hot arms 56, 60, current can also be applied to the beam 64 to cause the already vertically displaced member 72 to be displaced horizontally in the radial direction 82.

In yet another embodiment, the multi-directional thermal actuator 50 can be simultaneously displaced both vertically and horizontally. For example, current can be applied to three of the beams 56, 60, 64 to cause both vertical and horizontal displacement of the member 72 in the radial direction 90. Thermal expansion of the three beams 56, 60, 64 easily overcomes the stiffness of the cold beam 68. Displacement in the direction 90 is a preferred direction of radial displacement. By applying current to any combination of the three of the beams 56, 60, 64, 68, the member 72 can be displaced in any of the preferred directions of radial displacement 90, 92, 94, 96.

In another embodiment, the level of current applied to any three of the beams 56, 60, 64, 68 can be varied. For example, more current can be applied to the beam 60 than the beams 56, 64 so that the displacement is in the region between the direction 80 and the direction 90. When the current is terminated, the multi-directional thermal actuator 50 returns to its original, unactivated configuration illustrated in FIGS. 4 and 5. The above-noted factors can also be modified to emphasize motion in one or more radial directions of displacement, although not all embodiments will necessarily be capable of moving in all radial directions.

The force generated by the thermal actuator 50 will also be affected by the number of beams receiving current, the current density in those beams and the geometry of the beams. Displacement motivated by the thermal expansion of only one beam will generate less of a displacement force than displacement generated by the thermal expansion of two beams. Displacement motivated by the thermal expansion of two beams will generate less of a force than displacement generated by the thermal expansion of three beams.

The thermal actuator 50 illustrated in FIG. 5 will generate the maximum force in the preferred directions of radial displacement 90, 92, 94, 96 since current is applied to three of the beams 56, 60, 64, 68 simultaneously to cause this displacement. Since movement in the radial directions 80, 82, 84, 86 is motivated by application of current to only two adjacent beams, the potential force in those radial directions is less than in the radial directions 90, 92, 94, 96. In another example, the displacement force generated in the radial direction 90 by the application of current to the three beams 56, 60, 64 is greater than the force generated in the radial direction 90 by the thermal expansion of only the beam 56. Consequently, the cross-sectional configuration of the beams can be engineered to maximize the force generation in a particular radial direction.

Figure 6:
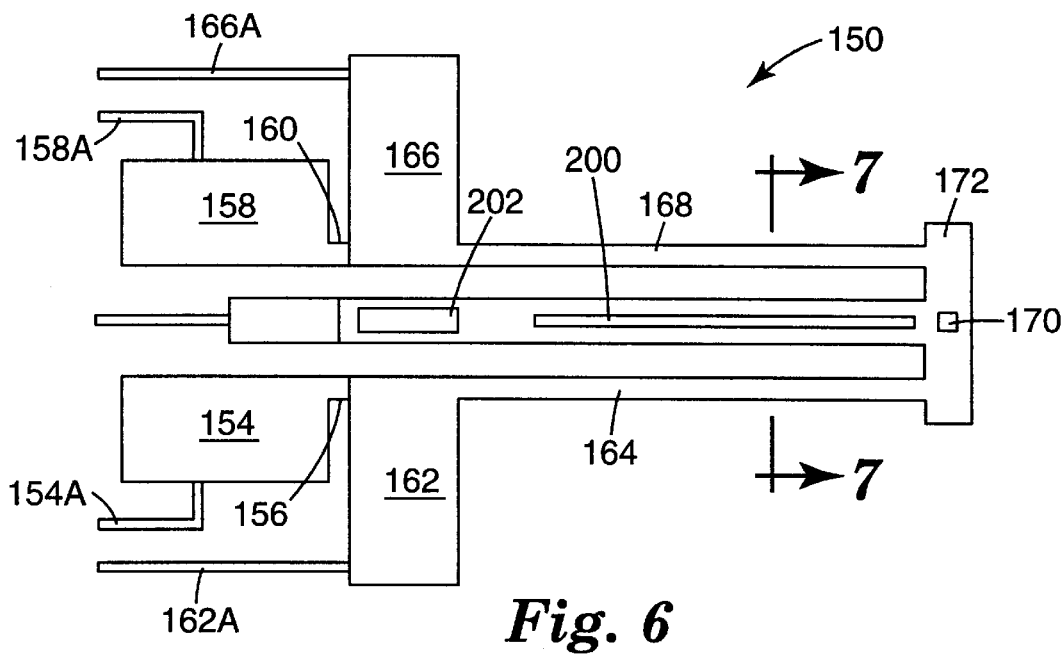
FIG. 6 is a top view of an alternate multi-directional thermal actuator in accordance with the present invention.

FIGS. 6 and 7 illustrate a second embodiment of a multi-directional thermal actuator 150 constructed on substrate 152 in accordance with the present invention. The multi-directional thermal actuator 150 of FIGS. 6 and 7 is generally similar to the multi-directional thermal actuator 50 of FIG. 3, except for the addition of centrally located beam 151 extending in a cantilevered fashion from anchor 153.

The multi-directional thermal actuator 150 includes anchor 154 with a first lower beam 156 extending in a cantilevered fashion therefrom and anchor 158 with a second lower beam 160 extending in a cantilevered fashion generally parallel to the first lower beam 156. Anchor 162 includes a first upper beam 164 extending in a cantilevered fashion therefrom and anchor 166 with a second upper beam 168 extending in a cantilevered fashion generally parallel to the first upper beam 164.

The beam 151 adds structural support to the actuator 150 and/or a common connection to electrical ground so that current can be supplied to one or more of the beams 156, 160, 164, 168. In the illustrated embodiment, the beam 151 is located generally symmetrically with respect to the beams 156, 160, 164, 168. In one embodiment, the beam 151 is located within a rectangular space defined by the beams 156, 160, 164, 168. The beam 151 can also be located asymmetrically relative to the beams 156, 160, 164, 168.

In the embodiment illustrated in FIG. 6, the anchors 153, 154, 158, 162, 166 are each connected to electrical traces 153A, 154A, 158A, 162A, 166A to deliver electrical current to and/or to electrically ground any of the beams 151, 156, 160, 164, 168.

The beams 151, 156, 160, 164, 168 are mechanically coupled at their respective distal ends by member 172. Via 170 is formed at the member 172 to mechanically couple the beams 151, 156, 160, 164, 168. Other structures may be used to mechanically couple the beams to the member. Two or more of the beams 151, 156, 160, 164, 168 can be electrically coupled to form a circuit. Alternatively, one or more of the beams 156, 160, 164, 168 can be connected to ground using a grounding tab (see FIG. 4). In an unactivated configuration, the beams 151, 156, 160, 164, 168 are generally parallel to the surface of the substrate 152.

In the illustrated embodiment, the beam 151 has a larger cross-sectional area to minimize current density and/or to add structural stability to the multi-directional thermal actuator 150. In one embodiment, the beam 151 is constructed of a material with lower electrical resistivity than the material used to construct the beams 156, 160, 164, 168. In another embodiment, a conductive layer is provided on the beam 151 to reduce current density relative to the current density in the beams 156, 160, 164, 168. Consequently, the net expansion of the beams 156, 160, 164, 168 for a given level of current will be greater than the expansion of the beam 151. That is, beam 151 operates as the cold beam.

In the illustrated embodiment, the beams 156, 160, 164, 168 have a generally equal cross-sectional area. The beams 156, 160, 164, 168 are arranged in a generally rectangular configuration as discussed in connection with FIGS. 3–5. In an alternate embodiment, the arrangement of the beams 156, 160, 164, 168 can be rotated relative to the beam 151 (see e.g., FIG. 8).

A circuit can be formed with the cold arm 151, the member 172, and one or more of the beams 154, 160, 164, 168. The common cold arm 151 permits current to be applied selectively to one or more of the beams 156, 160, 164, 168 so that the member 172 can be displaced in any radial direction. By applying current to any two adjacent beams 156, 160, 164, 168, the member 172 can be displaced in any of the radial directions 180, 182, 184, 186, as discussed above. Due to the cross-sectional shape of the cold arm 151, the directions 180, 186 are the preferred directions of radial displacement.

The cold arm 151 can optionally include a reinforcing member 200 and/or a flexure 202 formed near the anchor 153. As used herein, "reinforcing member" refers to one or more ridges, bumps, groove or other structural features that increase resistance to bending. The reinforcing members are preferably integral with the cold arm 151. In the illustrated embodiment, the reinforcing member 200 is a curvilinear ridge (see FIG. 7) extending along a portion of the cold arm 151, although it could be rectangular, square, triangular, or a variety of other shapes. Additionally, the reinforcing member 200 can be located in the center of the cold arm 151 or along the edges thereof. Multiple reinforcing members may also be used.

As used herein, "flexure" refers to a recess, depression, hole, slot, cutout, location of narrowed, thinned or weakened material, alternate material or other structural features or material change that provides controlled bending in a particular location. As used herein, "controlled bending" refers to bending that occurs primarily at a discrete location, rather than being distributed along the beams of the multi-directional thermal actuator. Controlled bending is another mechanism to provide a preferred direction of radial displacement. Alternate materials suitable for use as a flexure include polysilicon, metal, or polymeric material. The flexure 202 comprises the most flexible section of the cold arm 151, and hence, the location most likely to bend during actuation of the multi-directional thermal actuator 150.

The rigidity of the cold arm 151 relative to the rigidity of the flexure 202 and the beams 156, 160, 164, 168 determines to a large extent the magnitude (direction and amount) of the bending of the multi-directional thermal actuator 150. In one embodiment, the reinforcing member 200 is used in combination with the flexure 202. In another embodiment, the reinforcing member 200 extends along a portion of the cold arm 151, but no flexure is used. The portion of the cold arm 151 without the reinforcing member 200 is the location of controlled bending. In yet another alternate embodiment, the flexure 202 is formed in the cold arm 151 without the reinforcing member 200 such that the flexure 202 is the location of controlled bending.

FIG. 8 is a cross-sectional view of a thermal actuator 50A similar to FIG. 5, except that orientation of the beams 56A, 60A, 64A, 68A is rotated 45 degrees. Application of current to any two adjacent beams will result in displacement in one of the radial directions 90, 92, 94, 96. Application of current to any three beams 56A, 60A, 64A, 68A causes radial displacement in one of the directions 80, 82, 84, 86.

Figure 9:
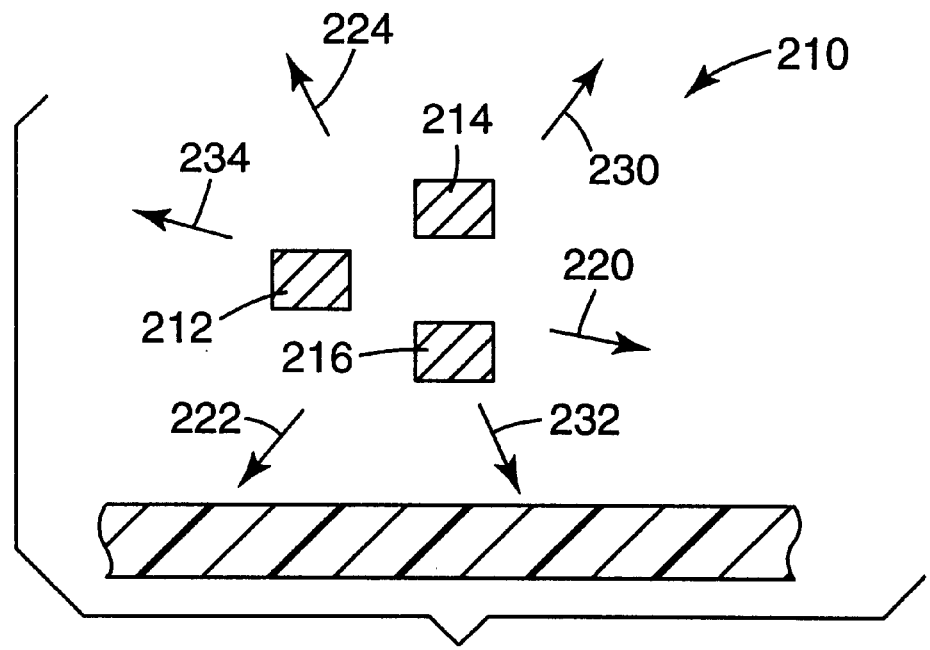
FIG. 9 is a sectional view of a three-beam thermal actuator in accordance with the present invention.
Figure 10:
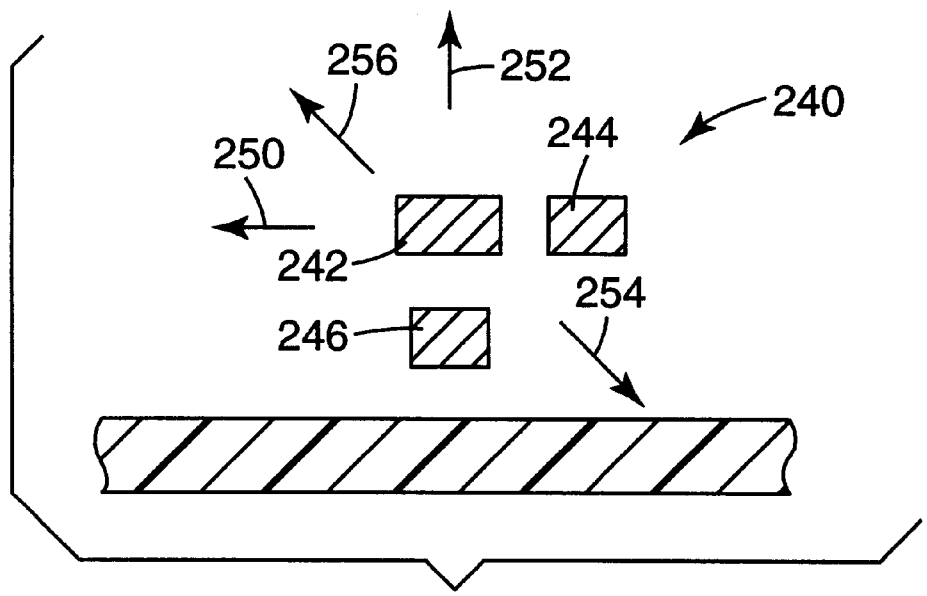
FIG. 10 is a sectional view of a three-beam, asymmetrical thermal actuator in accordance with the present invention.

FIG. 9 is a cross-sectional view of a three-beam version of a thermal actuator 210 similar to FIG. 5. In the illustrated embodiment, the beams 212, 214, 216 are arranged symmetrically. Application of current to one of the beams 212, 214, 216 (typically using the grounding tab shown in FIG. 4) will result in displacement in one of the radial directions 220, 222, 224. Application of current to any two adjacent beams 212, 214, 216 will result in displacement in one of the radial directions 230, 232, 234. Although the beams 212, 214, 216 are arranged generally symmetrically, an asymmetrical version that emphasizes displacement in one or more radial directions is possible.

FIG. 10 is a cross-sectional view of an alternate three-beam version of a thermal actuator 240 similar to FIG. 5. Beams 242, 244, 246 are arranged asymmetrically. The beam 242 has a larger cross-sectional area (and hence a lower current density) than beams 244, 246. Application of current to one of the beams 242, 244, 246 (typically using the grounding tab shown in FIG. 4) will result in displacement in one of the radial directions 250, 252, 254. Application of current to the two adjacent beams 246, 244 will result in displacement in the radial direction 256.

Due to the arrangement and the geometry of the individual beams 242, 244, 246, the thermal actuator 240 has a preferred direction of displacement in the direction 252 and a secondary, less preferred direction of displacement in the direction 250. This result is due primarily to the fact that the beam 242 will bend more easily in the direction 252 than in the direction 250.

Figure 11:
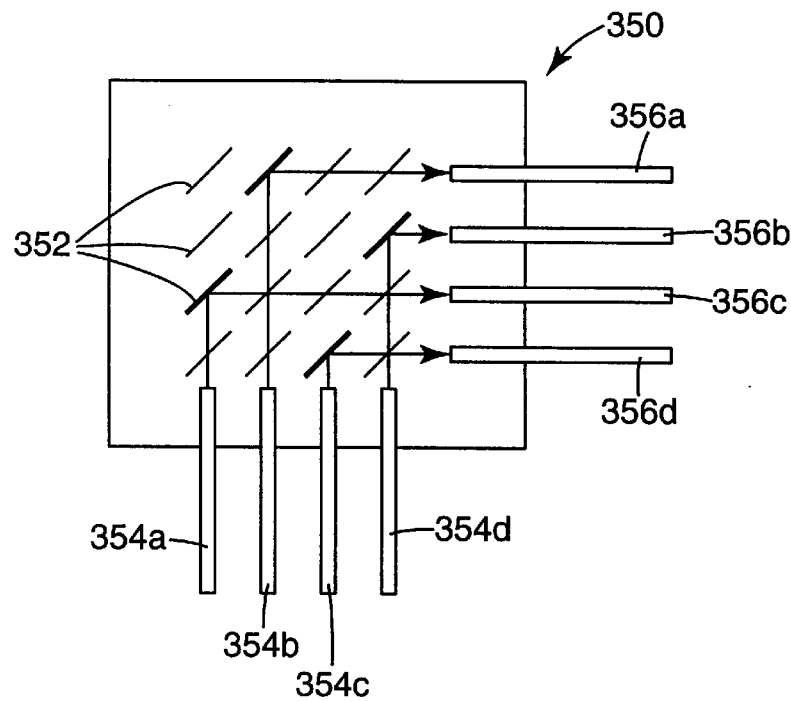
FIG. 11 is a schematic illustration of an optical switch in accordance with the present invention.

FIG. 11 is schematic illustration of an optical switch 350 utilizing a 4×4 array of optical devices 352. As used herein, "optical device" refers to reflectors, lenses, polarizing devices, wave guides, shutters, or occlusion devices. Each of the optical devices 352 is mechanically coupled to one or more multi-directional thermal actuators illustrated herein. In the in-plane position, the optical devices 352 do not extend into the optical path of input optical fibers 354a–354d. In the out-of-plane configuration, the optical devices 352 extend into the optical path of the input optical fibers 354a–354d. The array of vertical mirrors 352 are arranged to permit an optical signal from any of the input fibers 354a–354d to be optically coupled with any of the output fibers 356a–356d through selective actuation of the multi-directional thermal actuators. The optical switch 350 illustrated in FIG. 11 is for illustration purposes only. The present multi-directional thermal actuators may be used in any of a variety of optical switch architectures, such as an on/off switch (optical gate), 2×2 switch, one x n switch, or a variety of other architectures. The optical device can be part of an optical communication system.

All of the patents and patent applications disclosed herein, including those set forth in the Background of the Invention, are hereby incorporated by reference. Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. For example, any of the flexures, reinforcing structures, anchor locations and beam configurations disclosed herein can be combined to produce numerous multi-directional thermal actuators.

What is claimed is:

1. A multi-directional thermal actuator constructed on a surface of a substrate, the apparatus comprising:

a first beam cantilevered from an anchor at a first end to extend generally parallel to the surface of the substrate in an unactivated configuration;

a second beam cantilevered from an anchor at a first end to extend generally parallel to the surface of the substrate in an unactivated configuration;

a third beam cantilevered from an anchor at a first end to extend generally parallel to the surface of the substrate in an unactivated configuration, wherein the first, second, and third beams are not coplanar;

a member mechanically coupling distal ends of the first, second, and third beams;

a first circuit comprising at least the first beam, whereby application of current to the first circuit displaces the member in a first radial direction;

a second circuit comprising at least the second beam, whereby application of current to the second circuit displaces the member in a second radial direction; and a third circuit comprising at least the third beam, whereby application of current to the third circuit displaces the member in a third radial direction.

2. The apparatus of claim 1 comprising a grounding tab electrically coupling one or more of the beams to the substrate.

3. The apparatus of claim 1 comprising a resistance located between one or more of the beams and ground.

4. The apparatus of claim 1 wherein the first circuit comprises the first and second beams.

5. The apparatus of claim 1 wherein the second circuit comprises the second and third beams.

6. The apparatus of claim 1 wherein the third circuit comprises the third and first beams.

7. The apparatus of claim 1 wherein the first beam and a grounding tab comprises a fourth circuit, whereby application of current to the fourth circuit displaces the member in a fourth radial direction.

8. The apparatus of claim 1 wherein the second beam and a grounding tab comprise a fifth circuit, whereby application of current to the fifth circuit displaces the member in a fifth radial direction.

9. The apparatus of claim 1 wherein the third beam and a grounding tab comprise a sixth circuit, whereby application of current to the sixth circuit displaces the member in a sixth radial direction.

10. The apparatus of claim 1 comprising at least a fourth beam cantilevered from an anchor at a first end to extend generally parallel to the surface of the substrate in an unactivated configuration, the fourth beam being mechanically coupled to the member.

11. The apparatus of claim 10 comprising:
a seventh circuit comprising the first and fourth beams, whereby application of current to the seventh circuit displaces the member in a seventh radial direction;
an eighth circuit comprising the second and fourth beams, whereby application of current to the eighth circuit displaces the member in a eighth radial direction; and
a ninth circuit comprising the third and fourth beams, whereby application of current to the ninth circuit displaces the member in a ninth radial direction.

12. The apparatus of claim 11 comprising a tenth circuit comprising the first, second, and third beams, whereby application to the tenth circuit displaces the member in a tenth radial direction.

13. The apparatus of claim 12 wherein the tenth circuit comprises a third current density in the first beam and a fourth current density in the second beam less than the third current density resulting in displacement of the member in a eleventh radial direction.

14. The apparatus of claim 1 comprising a cold arm have a first end anchored to the surface of the substrate and a distal end mechanically coupled to the member.

15. The apparatus of claim 1 comprising a cold arm have a first end anchored to the surface of the substrate and a distal end mechanically and electrically coupled to the member.

16. The apparatus of claim 1 wherein the first, second, and third beams comprise a symmetrical cross-sectional configuration.

17. The apparatus of claim 1 wherein the first, second, and third beams comprise an asymmetrical cross-sectional configuration.

18. The apparatus of claim 10 wherein the first, second, third and fourth beams comprise a generally rectangular cross-sectional configuration.

19. The apparatus of claim 1 comprising a plurality of multi-directional thermal actuators on the substrate.

20. A multi-directional thermal actuator constructed on a surface of a substrate, the apparatus comprising:
at least three beams each cantilevered from one or more anchors at a first end to extend generally parallel to the surface of the substrate in an unactivated state, wherein at least one of the beams is not coplanar with the other two beams; and
a member mechanically coupling distal ends of the beams, whereby application of current to a circuit comprising combinations of any two or more of the beams displaces the member in one of three or more non-parallel radial directions, respectively.

21. A multi-directional thermal actuator constructed on a surface of a substrate, the apparatus comprising:
four beams each cantilevered from one or more anchors at a first end to extend generally parallel to the surface of the substrate, the beams being arranged in a generally rectangular cross-sectional configuration; and
a member mechanically coupling distal ends of the beams.

22. The apparatus of claim 21 wherein two of the beams comprise upper beams and two of the beams comprise lower beams, the two upper beams being arranged above the two lower beams relative to the surface of the substrate.

23. The apparatus of claim 22 wherein the actuator exhibits vertically upward displacement when current is applied to the two lower beams.

24. The apparatus of claim 22 wherein the actuator exhibits vertically downward displacement when current is applied to the two upper beams.

25. The apparatus of claim 22 wherein the actuator exhibits horizontal displacement when current is applied to one of the lower beams and the upper beam located above the lower beam.

26. The apparatus of claim 21 wherein one of the beams is arranged above another of the beams and two of the beams are laterally offset therefrom.

27. The apparatus of claim 21 wherein the actuator exhibits both horizontal and vertical displacement when current is applied to any three of the beams.

28. The apparatus of claim 21 comprising a cold arm having a first end anchored to the surface and a distal end attached to the member, the cold arm being located generally parallel with the beams and within a generally rectangular space bounded by the beams.

29. The apparatus of claim 21 comprising a cold arm centrally located relative to the beams, the cold arm having a first end anchored to the surface and a distal end connected to the member.

30. The apparatus of claim 21 comprising a cold arm symmetrically located relative to the beams, the cold arm having a first end anchored to the surface and a distal end connected to the member.

31. The apparatus of claim 21 comprising a cold arm having a first end anchored to the surface and a distal end attached to the member.

32. The apparatus of claim 31 comprising a flexure formed in the cold arm near the first end thereof adapted to provide controlled bending.

33. The apparatus of claim 32 wherein the flexure comprises at least one of a recess, depression, cut-out, hole, location of narrowed, thinned or weakened material, alternate material or other structural features or material change that decreases resistance to bending in that location.

34. The apparatus of claim 31 comprising a reinforcing member formed in the cold arm.

35. The apparatus of claim 34 wherein the reinforcing member is integrally formed in the cold arm.

36. The apparatus of claim 31 comprising a metal layer extending along the cold arm.

37. The apparatus of claim 31 wherein the cold arm is electrically isolated from the beams.

38. The apparatus of claim 31 wherein the beams and the cold arm comprise a circuit through which electric current is passed.

39. The apparatus of claim 31 wherein the actuator exhibits both horizontal and vertical displacement when current is applied to a circuit comprising the cold arm and any one of the beams.

40. The apparatus of claim 31 wherein the actuator exhibits both horizontal and vertical displacement when current is applied to a circuit comprising the cold arm and any three of the beams.

41. The apparatus of claim 31 wherein the cold arm exhibits a lower current density than the beams at a given voltage.

42. The apparatus of claim 21 comprising a grounding tab electrically coupling one or more of the beams to the substrate.

43. The apparatus of claim 21 comprising a plurality of multi-directional thermal actuators on the substrate.

44. The apparatus of claim 21 comprising at least one optical device mechanically coupled to the multi-directional thermal actuator.

45. The apparatus of claim 44 wherein the optical device comprises one of a reflector, a lens, a polarizer, a wave guide, a shutter, or an occluding structure.

46. The apparatus of claim 44 comprising an optical communication system including at least one optical device.

\* \* \* \* \*